United States Patent
Price et al.

(10) Patent No.: US 10,553,244 B2
(45) Date of Patent: Feb. 4, 2020

(54) SYSTEMS AND METHODS OF INCREASING LIGHT DETECTION IN COLOR IMAGING SENSORS

(71) Applicant: Microsoft Technology Licensing, LLC, Redmond, WA (US)

(72) Inventors: Raymond Kirk Price, Redmond, WA (US); Michael Bleyer, Seattle, WA (US); Denis Demandolx, Bellevue, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 274 days.

(21) Appl. No.: 15/653,753

(22) Filed: Jul. 19, 2017

(65) Prior Publication Data

US 2019/0027183 A1 Jan. 24, 2019

(51) Int. Cl.
*G11B 7/131* (2012.01)
*G11B 7/004* (2006.01)
(Continued)

(52) U.S. Cl.
CPC ............ *G11B 7/131* (2013.01); *G11B 7/004* (2013.01); *H01L 25/0753* (2013.01); *H01L 27/14643* (2013.01); *H04N 5/2256* (2013.01)

(58) Field of Classification Search
CPC .. H04N 9/045; H04N 9/0455; H04N 9/04551; H04N 9/04553; H04N 9/04557; H04N 9/04559; H04N 5/2256; H01L 25/0753; H01L 27/146; H01L 27/14645; H01L 27/14649; H01L 27/1465;
(Continued)

(56) References Cited

U.S. PATENT DOCUMENTS 7,477,304 B2 * 1/2009 Hu .................. H04N 9/045
  348/272
8,619,143 B2 12/2013 Motta
(Continued)

OTHER PUBLICATIONS

"How much light and resolution is lost to color filter arrays?", http://photo.stackexchange.com/questions/87528/how-much-light-and-resolution-is-lost-to-color-filter-arrays, Retrieved on: Mar. 30, 2017, 3 pages.
(Continued)

*Primary Examiner* — John R Lee
(74) *Attorney, Agent, or Firm* — Ray Quinney & Nebeker P.C.; John O. Carpenter

(57) ABSTRACT

A device for detecting light includes a photoreceptor array that is sensitive to the visible light spectrum and has a first wavelength sensor, a second wavelength sensor, and a third wavelength sensor. The first wavelength sensor has a first peak sensitivity at a first wavelength. The second wavelength sensor has a second peak sensitivity at a second wavelength. The third wavelength sensor has a third peak sensitivity at a third wavelength. The first wavelength sensor has a first base sensitivity at least 30% of the first peak sensitivity at the second wavelength and third wavelength. The second wavelength sensor has a second base sensitivity at least 30% of the second peak sensitivity at the first wavelength and third wavelength. The third wavelength sensor has a third base sensitivity at least 30% of the third peak sensitivity at the first wavelength and second wavelength.

20 Claims, 5 Drawing Sheets

(51) Int. Cl.
*H01L 25/075* (2006.01)
*H01L 27/146* (2006.01)
*H04N 5/225* (2006.01)

(58) Field of Classification Search
CPC ........... H01L 27/1467; H01L 27/14652; H01L 27/14868; H01L 27/14875; H01L 27/14881; G01B 7/004; G11B 7/131; G11B 7/004
See application file for complete search history.

(56) References Cited

U.S. PATENT DOCUMENTS

| | | | |
|---|---|---|---|
| 9,425,227 B1* | 8/2016 | Wang | H01L 27/14621 |
| 2007/0145273 A1 | 6/2007 | Chang | |
| 2010/0295947 A1 | 11/2010 | Boulanger | |
| 2015/0221691 A1* | 8/2015 | Watanabe | H04N 5/332 348/164 |
| 2016/0254300 A1* | 9/2016 | Wajs | H01L 27/14607 257/435 |
| 2017/0068027 A1* | 3/2017 | Powell | G02B 5/281 |
| 2017/0111618 A1* | 4/2017 | Hsieh | G02B 3/005 |
| 2017/0150071 A1* | 5/2017 | Otsubo | G02B 5/20 |
| 2017/0160548 A1* | 6/2017 | Woltman | G02B 27/0172 |
| 2018/0041718 A1* | 2/2018 | Price | H04N 13/257 |
| 2018/0164156 A1* | 6/2018 | Price | H04N 5/332 |
| 2018/0176487 A1* | 6/2018 | Price | H04N 5/332 |
| 2018/0182069 A1* | 6/2018 | Xiong | G06T 3/4061 |
| 2018/0197274 A1* | 7/2018 | Price | G06T 3/4015 |
| 2018/0197275 A1* | 7/2018 | Price | G06T 3/4015 |
| 2018/0203230 A1* | 7/2018 | Vallius | G02B 27/0081 |
| 2019/0027183 A1* | 1/2019 | Price | G11B 7/131 |

OTHER PUBLICATIONS

Wang, et al., "Ultra-high-sensitivity color imaging via a transparent diffractive-filter array and computational optics", In Journal of Optica vol. 2, No. 11, Oct. 29, 2015, pp. 933-939.

"When Monochrome Cameras are the Best Solution", https://www.lumenera.com/blog/monochrome-cameras, Published on: Mar. 31, 2016, 2 pages.

Lule, et al., "Sensitivity of CMOS based imagers and scaling perspectives", In Journal of IEEE Transactions on Electron Devices, vol. 47, Issue 11, Nov. 2000, pp. 2110-2122.

Kuniba, et al., "Spectral sensitivity optimization of color image sensors considering photon shot noise", In Journal of Electronic Imaging, vol. 18, Issue 2, Apr. 29, 2009, 2 pages.

* cited by examiner

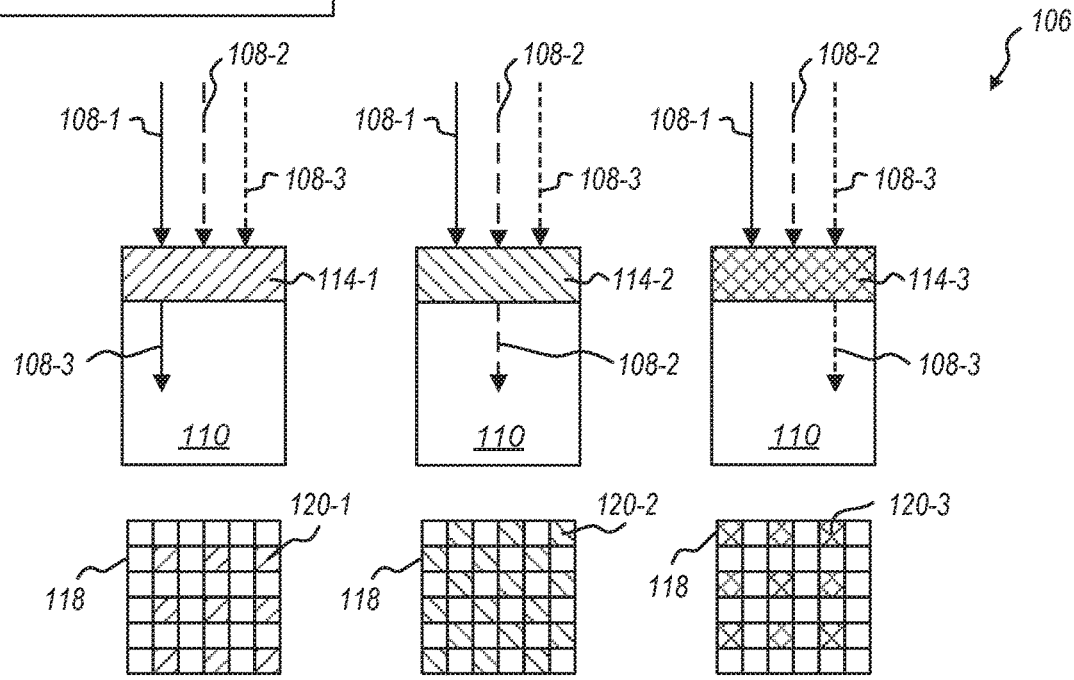
*Figure 3-1*  *Figure 3-2*  *Figure 3-3*
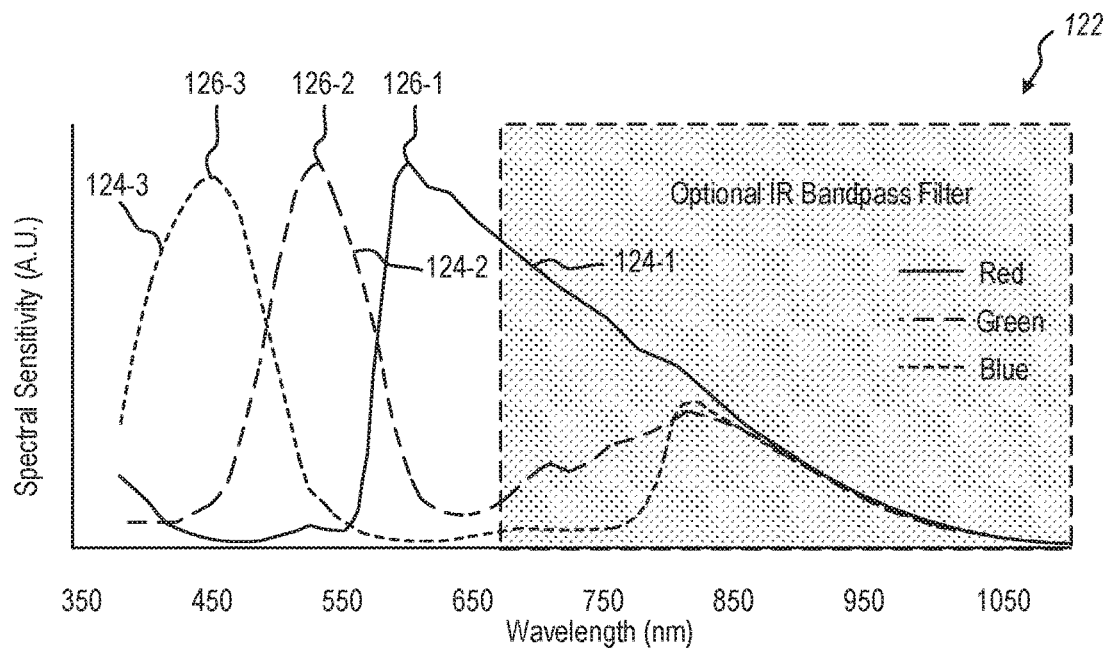
*Figure 4*

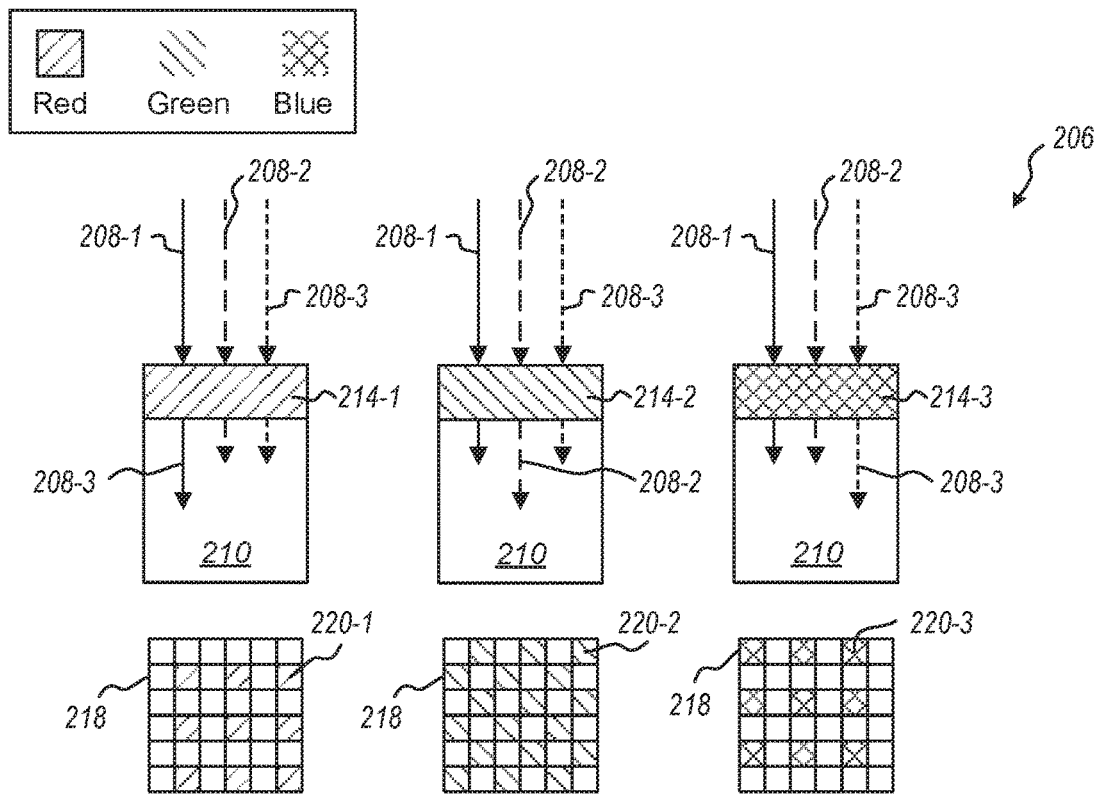
*Figure 5-1*   *Figure 5-2*   *Figure 5-3*
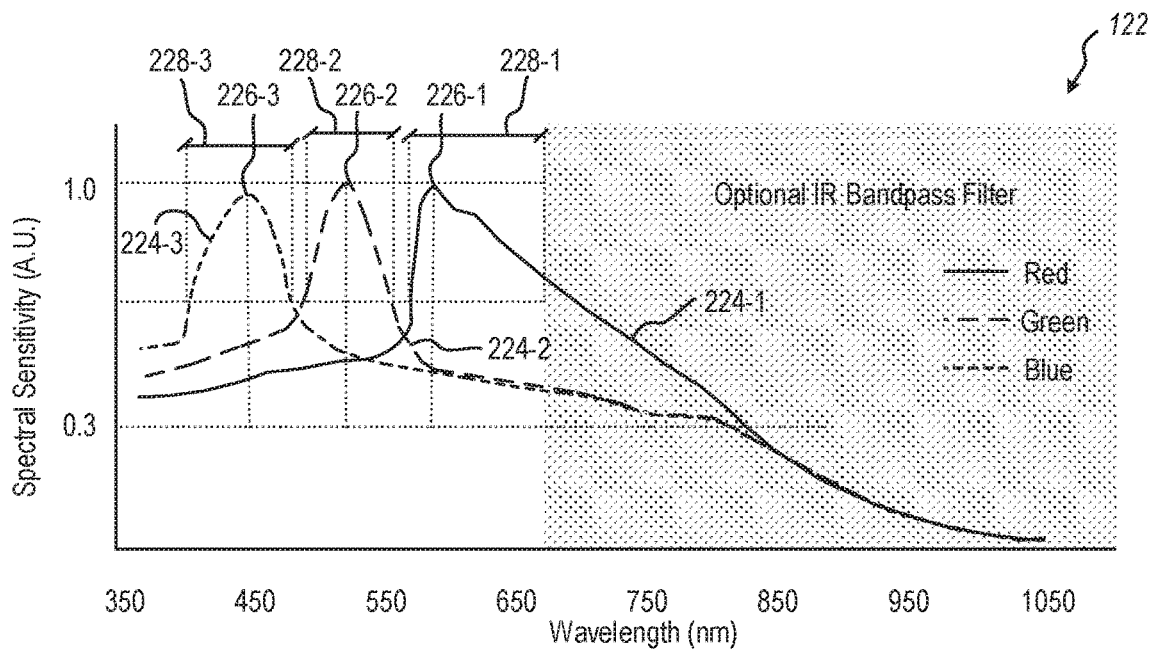
*Figure 6*

SYSTEMS AND METHODS OF INCREASING LIGHT DETECTION IN COLOR IMAGING SENSORS

CROSS-REFERENCE TO RELATED APPLICATIONS

N/A

BACKGROUND

Use of computing devices is becoming more ubiquitous by the day. Computing devices range from standard desktop computers to wearable computing technology and computers integrated into many commonplace devices. Due to the variety of device and applications, computing devices are being used in an ever-increasing variety of environments and conditions.

Some computing devices including imaging sensors to image the surrounding environment or aspects of the environment near the computer. For example, some wearable devices, such as head-mounted displays, image the environment to replicate the field of view of the user. Other computing devices are integrated into devices, such as automobiles or factory machinery to assist a human operator in operating the device in a safe manner. Other computing devices are incorporated into devices to allow partially or fully autonomous operation of the device.

The environments in which the computing devices are used vary from bright sunlight, for example, in an automobile on a road surface in the middle of the day, to poorly illuminated—or unilluminated—indoor or sheltered environments, such as a user's basement, a warehouse, nighttime applications, or underwater applications. Conventional imaging sensors compromise light detection for color image reconstruction. This compromise can limit the application of color imaging sensors in low-light applications.

SUMMARY

In some embodiments, a device for detecting light includes a photoreceptor array that is sensitive to the visible light spectrum and has a first wavelength sensor, a second wavelength sensor, and a third wavelength sensor. The first wavelength sensor has a first peak sensitivity at a first wavelength. The second wavelength sensor has a second peak sensitivity at a second wavelength. The third wavelength sensor has a third peak sensitivity at a third wavelength. The first wavelength sensor has a first base sensitivity at least 30% of the first peak sensitivity at the second wavelength and third wavelength. The second wavelength sensor has a second base sensitivity at least 30% of the second peak sensitivity at the first wavelength and third wavelength. The third wavelength sensor has a third base sensitivity at least 30% of the third peak sensitivity at the first wavelength and second wavelength.

In other embodiments, a device for detecting light includes a photoreceptor array that is sensitive to the visible light spectrum and has a Bayer pattern including a first wavelength sensor, a second wavelength sensor, a third wavelength sensor, and a fourth wavelength sensor. The first wavelength sensor has a first peak sensitivity at a first wavelength. The second wavelength sensor has a second peak sensitivity at a second wavelength. The third wavelength sensor has a third peak sensitivity at a third wavelength. The fourth wavelength sensor has a fourth peak sensitivity in the infrared spectrum. The first wavelength sensor has a first base sensitivity at least 30% of the first peak sensitivity at the second wavelength and third wavelength. The second wavelength sensor has a second base sensitivity at least 30% of the second peak sensitivity at the first wavelength and third wavelength. The third wavelength sensor has a third base sensitivity at least 30% of the third peak sensitivity at the first wavelength and second wavelength.

In yet other embodiments, a method of manufacturing an imaging sensor includes providing a photoreceptor array having at least one domain. The method further includes positioning a first partial filter over a first pixel of a domain of the photoreceptor array, positioning a second partial filter over a second pixel of the domain of the photoreceptor array, and positioning a third partial filter over a third pixel of the domain of the photoreceptor array.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 3-1 through FIG. 3-3 are schematic side cross-sectional views of an embodiment of a conventional imaging sensor attenuating light, according to at least one embodiment of the present disclosure;

FIG. 4 is a graph of a spectral sensitivity of an embodiment of a conventional imaging sensor, according to at least one embodiment of the present disclosure;

FIG. 5-1 through FIG. 5-3 are schematic side cross-sectional views of an embodiment of an increased sensitivity imaging sensor attenuating light, according to at least one embodiment of the present disclosure;

FIG. 6 is a graph of a spectral sensitivity of an embodiment of an increased sensitivity imaging sensor, according to at least one embodiment of the present disclosure;

DETAILED DESCRIPTION

This disclosure generally relates to devices, systems, and methods for detecting light. More particularly, the present disclosure related to embodiments of increased sensitivity color imaging sensors relative to conventional color imaging sensors. In some embodiments, an embodiment of a color imaging sensor according to the present disclosure may have a wavelength sensitivity spectrum with overlapping color channels. In one example, at least one of the color channels of an imaging sensor according to the present disclosure may exhibit at least 30% of a peak sensitivity (e.g., the sensitivity at the peak wavelength of that color channel) at the peak wavelength of at least one other color channel. For example, a red channel may exhibit at least 30% of the peak sensitivity of the red channel (e.g., at about 600 nanometers) at the wavelength of the peak sensitivity of the green channel (e.g., at about 550 nm).

Conventional color imaging sensors utilize a plurality of color channels that detect light of a particular wavelength range. Each of the color channels may be discrete from one another with little to no overlap between the color channels. In some embodiments, neighboring color channels may exhibit a spectral sensitivity of no more than 20% of maximum sensitivity at a shared wavelength. For example, the red channel of a conventional Red-Green-Blue ("RGB") imaging sensor may exhibit a spectral sensitivity of no more than 20% at any location in the neighboring green channel. In other examples, the spectral sensitivity may be less than 10%, or ideally 0%, among shared wavelengths between channels. This discrete detection of red light in the red channel and green light in the green channel may aid in producing color mixed images that approximate human vision.

Figure 1:
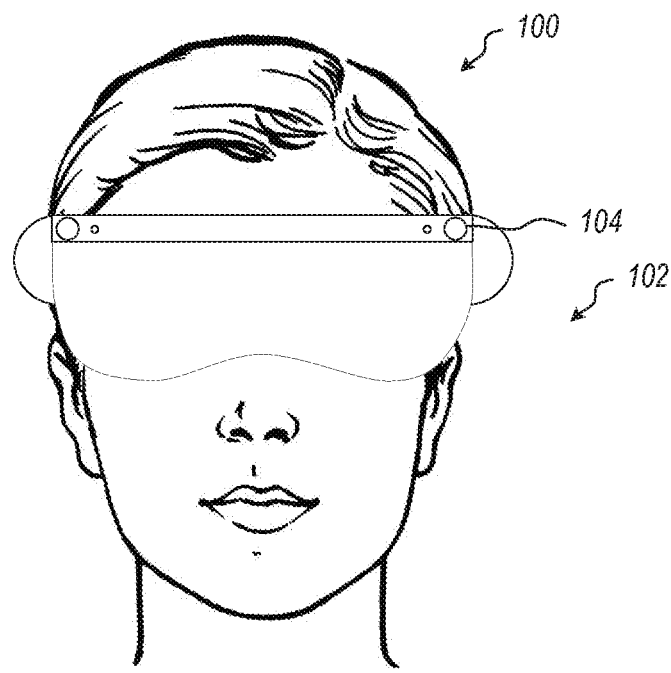
FIG. 1 is a front view of an embodiment of an electronic device with an imaging sensor, according to at least one embodiment of the present disclosure.

Color imaging sensors may be utilized in a variety of electronic devices or machinery, such as wearable computing devices, automotive applications, industrial machinery, aerial devices (e.g., drones), or other devices that collect, record, or transmit visual information. For example, FIG. 1 is a front view of user 100 wearing a head-mounted display ("HMD") 102 including a camera 104. The camera 104 may image the environment of the user 100 and incorporate the visual information of the environment into an image displayed to the user, or the camera 104 may image the environment of the user 100 to monitor user's proximity to objects in the environment to increase the user's safety during use of the HMD 102. In other examples, the camera 104 may collect information about the user's environment or the user's movement in the environment for later reference, analysis, or evaluation.

The camera 104 may include an imaging sensor that is configured to collect light from the environment. For example, the imaging sensor may collect visible light, infrared light, ultraviolet light, or combinations thereof. In some embodiments, the imaging sensor may collect visible light in color channels to recreate a color image that approximates human vision. For example, the imaging sensor may use a RGB distribution of color channels, a CMYK distribution of color channels, or another distribution of the color channels to provide images for a user 100. In other embodiments, the imaging sensor may collect light in color channels not visible to a human, or in a color balance that does not approximate human vision.

Figure 2:
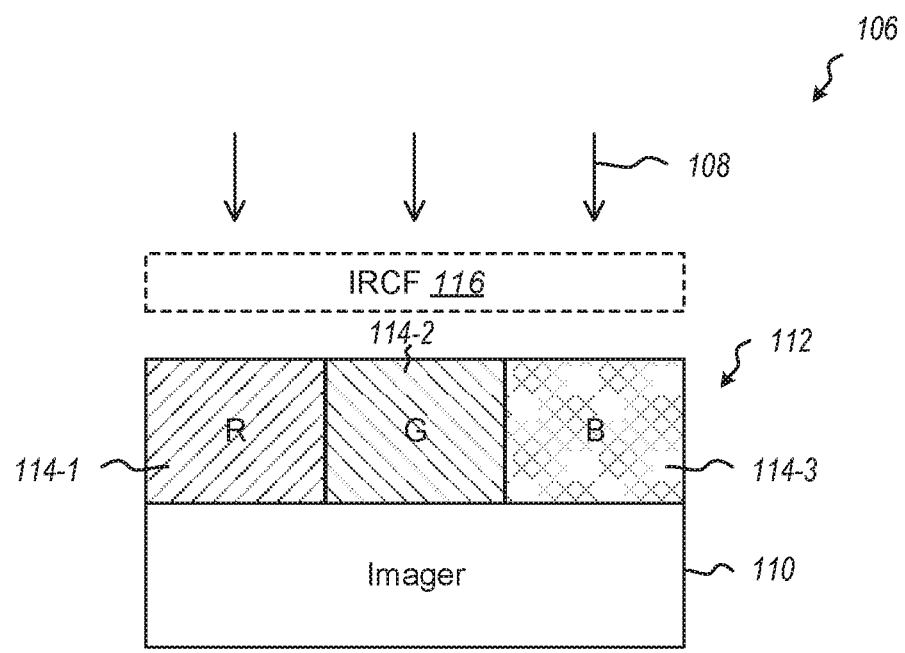
FIG. 2 is a schematic side cross-sectional view of an embodiment of an imaging sensor, according to at least one embodiment of the present disclosure.

FIG. 2 is a schematic side cross-sectional view of a conventional RGB imaging sensor 106. The imaging sensor 106 may receive light 108 from the environment and detect the presence of the light with an imager 110. In some embodiments, the light 108 may be ambient light, such as natural or solar light, or the light 108 may be artificial light such as electric lighting (e.g., halogen, fluorescent, incandescent, LED, or other electric lighting) in a building or outdoor space. The light 108 may have different emission spectra depending on the source. While the present disclosure may describe the light source as a continuous spectrum, it should be understood that the spectral sensitivities described herein are independent of the emission spectrum of the light source.

The imager 110 may convert incident photons from the light 108 that reach the imager 110 to an electrical signal. This electrical signal may be amplified and/or read out to create a mosaic image of discrete color channels that approximates human vision of the field of view (FOV) of the camera. The imaging sensor 106 may include a plurality of filters 114-1, 114-2, 114-3 positioned proximate a surface of the imager 110 to control what portion of the spectrum of the light 108 reaches the imager 110.

In the depicted embodiment of a RGB imaging sensor 106, the imaging sensor 106 may include a red filter 114-1, a green filter 114-2, and a blue filter 114-3. In other embodiments with other color channel combinations, such as a CMYK, the filters may be related to the selected color combination. In some embodiments, the red filter 114-1 may allow transmission of only the red portion of the light 108, the green filter 114-2 may allow transmission of only the green portion of the light 108, and the blue filter 114-3 may allow transmission of only the blue portion of the light 108. In other embodiments, at least one of the red filter 114-1, green filter 114-2, and blue filter 114-3 may allow transmission of a portion of the light 108 in the non-visible spectrum, and an infrared color filter 116 may be positioned proximate the red filter 114-1, green filter 114-2, and blue filter 114-3 to attenuate the infrared portion of the light 108 incident on the imaging sensor 106.

FIG. 3-1 through FIG. 3-3 illustrate the attenuation of portions of an incident white light by the color filters of the embodiment of a conventional imaging sensor 106 described in relation to FIG. 2. FIG. 3-1 illustrates an incident light approximated as including a red portion 108-1, a green portion 108-2, and a blue portion 108-3. The red filter 114-1 attenuates substantially all of the green portion 108-2 and the blue portion 108-3 while allowing the red portion 108-1 through to the imager 110. In some embodiments, the imaging sensor 106 may be an array 118 of pixels. The pixels may each be a discrete color channel with the color filters at least partially determining the color channel of each pixel. For example, the array 118 may include a conventional Bayer pattern with the red filter 114-1 positioned over the red pixels 120-1.

In some embodiments, the red pixels 120-1 may be one pixel of four pixels in each domain of the Bayer pattern. The attenuation of the green portion 108-2 and the blue portion 108-3 of the incident light may reduce the overall amount of light reaching the red pixels 120-1 by approximately two-thirds. Therefore, the attenuation of the green portion 108-2 and the blue portion 108-3 of the incident light at the red pixels 120-1 amounts to attenuation of one-sixth of the available light incident upon the imaging sensor 106 as a whole.

FIG. 3-2 illustrates the incident light of FIG. 3-1 approximated as including a red portion 108-1, a green portion 108-2, and a blue portion 108-3. The green filter 114-2 attenuates substantially all of the red portion 108-1 and the blue portion 108-3 while allowing the green portion 108-2 through to the imager 110. The array 118 may include a conventional RGB Bayer pattern with the green filter 114-2 positioned over the green pixels 120-2.

In a conventional RGB Bayer pattern, half of the pixels are green pixels 120-2 to allow for more accurate color reproduction according to human vision. The attenuation of the red portion 108-1 and the blue portion 108-3 of the incident light may reduce the overall amount of light reaching the green pixels 120-2 by approximately two-thirds. Therefore, the attenuation of the red portion 108-1 and the blue portion 108-3 of the incident light at the green pixels 120-2 amounts to attenuation of one-third of the available light incident upon the imaging sensor 106 as a whole.

FIG. 3-3 illustrates the incident light of FIG. 3-1 approximated as including a red portion 108-1, a green portion 108-2, and a blue portion 108-3. The blue filter 114-3 attenuates substantially all of the red portion 108-1 and the green portion 108-2 while allowing the blue portion 108-3 through to the imager 110. The array 118 may include a conventional Bayer pattern with the blue filter 114-3 positioned over the blue pixels 120-3.

In some embodiments, the blue pixels 120-3 may be one pixel of four pixels in each domain of the Bayer pattern. The attenuation of the red portion 108-1 and the green portion 108-2 of the incident light may reduce the overall amount of light reaching the blue pixels 120-3 by approximately two-thirds. Therefore, the attenuation of the red portion 108-1 and the green portion 108-2 of the incident light at the red pixels 120-1 amounts to attenuation of one-sixth of the available light incident upon the imaging sensor 106 as a whole.

In total the attenuation of two-thirds of the incident light at each of the red pixels 120-1, the green pixels 120-2, and the blue pixels 120-3 may result in imaging of one-third or less of all incident light on the imaging sensor. FIG. 4 is a spectral sensitivity chart 122 illustrating the spectral sensitivity of a conventional CMOS sensor with RGB color channels. The red sensitivity spectrum 124-1, the green sensitivity spectrum 124-2, and the blue sensitivity spectrum 124-3 are normalized to a maximum sensitivity of the imaging sensor.

In some embodiments, the red sensitivity spectrum 124-1 may have a red peak sensitivity 126-1, the green sensitivity spectrum 124-2 may have a green peak sensitivity 126-2, and the blue sensitivity spectrum 124-3 may have a blue peak sensitivity 126-3. The green sensitivity spectrum 124-2 and the blue sensitivity spectrum 124-3 at the wavelength of the red peak sensitivity 126-1 may each be less than 20% of the red peak sensitivity 126-1. The red sensitivity spectrum 124-1 and the blue sensitivity spectrum 124-3 at the wavelength of the green peak sensitivity 126-2 may each be less than 20% of the green peak sensitivity 126-2. The red sensitivity spectrum 124-1 and the green sensitivity spectrum 124-2 at the wavelength of the blue peak sensitivity 126-3 may each be less than 20% of the blue peak sensitivity 126-3.

In some embodiments, the low sensitivity of each color channel at the peak sensitivity of the other color channels may provide greater separation between the color channels and greater definition in the color detection. In other embodiments, the high attenuation of the incident light in each color channel away from the peak sensitivity reduces the overall sensitivity of the imaging sensor, thereby limiting performance in certain applications.

For example, the overall attenuation of the light may reduce the effectiveness of the imaging sensor in a low-light environment, at higher framerates, or in small active area devices. For example, given the same amount of flux to the imaging sensor, the amount of light that is collected in each frame by the imaging sensor will reduce as the framerate increases. For example, a 60 Hertz camera may collect half of the light per frame as compared to a 30 Hertz camera in the same environment. Introducing an artificial gain to the image collected at 60 Hz may introduce noise or other artifacts to the image, degrading the quality of the image. Conventionally, a higher framerate image may be "binned" or have signal from multiple pixels combined by reducing the resolution of the image. In other examples, an imaging sensor with a smaller active area will have a reduced pixel size while trying to maintain a consistent resolution. To improve the signal detection, the pixel size may be increased by compromising image resolution.

FIG. 5-1 through FIG. 5-3 illustrate an embodiment of an imaging sensor 206 with partial color filters. In some embodiments, a color filter may allow transmission at or near a particular wavelength while partially attenuating light at wavelengths away from the peak wavelength. The partial attenuation allows at least 30% of the incident light through the partial filter in other color channels.

FIG. 5-1 illustrates an incident light approximated as including a red portion 208-1, a green portion 208-2, and a blue portion 208-3. A red partial filter 214-1 attenuates substantially no more than 70% of the green portion 208-2 and no more than 70% of the blue portion 208-3 while allowing substantially all of the red portion 208-1 through to an imager 210. In some embodiments, the imaging sensor 206 may be an array 218 of pixels. The pixels may each be a primary color channel with the partial color filters at least partially determining the color channel of each pixel. For example, the array 218 may include a conventional Bayer pattern with the red partial filter 214-1 positioned over the red pixels 220-1.

In some embodiments, the red pixels 220-1 may be one pixel of four pixels in each domain of the Bayer pattern. The partial attenuation of the green portion 208-2 and the blue portion 208-3 of the incident light may reduce the overall amount of light reaching the red pixels 220-1 by less than 47.0%. In other embodiments, the red partial filter 214-1 may transmit more than 50% of the incident light. In yet other embodiments, the red partial filter 214-1 may transmit more than 60% of the incident light.

FIG. 5-2 illustrates the incident light of FIG. 5-1 approximated as including a red portion 208-1, a green portion 208-2, and a blue portion 208-3. The green partial filter 214-2 attenuates no more than 70% of the red portion 208-1 and no more than 70% of the blue portion 208-3 while allowing substantially all of the green portion 208-2 through to the imager 210. The array 218 may include a conventional RGB Bayer pattern with the green filter 214-2 positioned over the green pixels 220-2.

In a conventional RGB Bayer pattern, half of the pixels are green pixels 220-2 to allow for more accurate color reproduction according to human vision. The partial attenuation of the red portion 208-1 and the blue portion 208-3 of the incident light may reduce the overall amount of light reaching the green pixels 220-2 by less than 47.0%. In other embodiments, the green partial filter 214-2 may transmit more than 50% of the incident light. In yet other embodiments, the green partial filter 214-2 may transmit more than 60% of the incident light.

FIG. 5-3 illustrates the incident light of FIG. 5-1 approximated as including a red portion 208-1, a green portion 208-2, and a blue portion 208-3. The partial blue filter 214-3 attenuates no more than 70% of the red portion 208-1 and no more than 70% of the green portion 208-2 while allowing substantially all of the blue portion 208-3 through to the imager 210. The array 218 may include a conventional Bayer pattern with the partial blue filter 214-3 positioned over the blue pixels 220-3.

In some embodiments, the blue pixels 220-3 may be one pixel of four pixels in each domain of the Bayer pattern. The partial attenuation of the red portion 208-1 and the green portion 208-2 of the incident light may reduce the overall amount of light reaching the blue pixels 220-3 by less than 47.0%. In other embodiments, the blue partial filter 214-3 may transmit more than 50% of the incident light. In yet other embodiments, the blue partial filter 214-3 may transmit more than 60% of the incident light.

In total, the transmission of a greater proportion of the incident light at each of the red pixels 220-1, the green pixels 220-2, and the blue pixels 220-3 may result in imaging of at least 47% of the incident light on the imaging sensor. In other embodiments, the imaging sensor may detect at least 50% of the incident light. In yet other embodiments, the imaging sensor may detect at least 60% of the incident light.

In some embodiments, the imager 210 may be a complimentary metal-oxide semiconductor (CMOS) imager 210. In other embodiments, the imager 210 may be a charge coupled device (CCD) imager 210 or other semiconductor configured to detect photons incident on a surface of the semiconductor. While the present disclosure may describe the imager as a CMOS, it should be understood that the imager 210 may be any type of semiconductor device capable of detecting photons in at least the visible light range.

FIG. 6 is a spectral sensitivity chart 222 illustrating the spectral sensitivity of an increased sensitivity CMOS sensor with RGB color channels, according to the present disclosure. The red sensitivity spectrum 224-1, the green sensitivity spectrum 224-2, and the blue sensitivity spectrum 224-3 are normalized to a maximum sensitivity of the imaging sensor.

In some embodiments, the red sensitivity spectrum 224-1 may have a red peak sensitivity 226-1, the green sensitivity spectrum 224-2 may have a green peak sensitivity 226-2, and the blue sensitivity spectrum 224-3 may have a blue peak sensitivity 226-3. The green sensitivity spectrum 224-2 and the blue sensitivity spectrum 224-3 at the wavelength of the red peak sensitivity 126-1 may each be greater than 30% of the red peak sensitivity 126-1. The red sensitivity spectrum 224-1 and the blue sensitivity spectrum 224-3 at the wavelength of the green peak sensitivity 226-2 may each be greater than 30% of the green peak sensitivity 226-2. The red sensitivity spectrum 224-1 and the green sensitivity spectrum 224-2 at the wavelength of the blue peak sensitivity 226-3 may each be greater than 30% of the blue peak sensitivity 226-3.

In other embodiments, the green sensitivity spectrum 224-2 and the blue sensitivity spectrum 224-3 at the wavelength of the red peak sensitivity 126-1 may each be greater than 40% of the red peak sensitivity 126-1. The red sensitivity spectrum 224-1 and the blue sensitivity spectrum 224-3 at the wavelength of the green peak sensitivity 226-2 may each be greater than 40% of the green peak sensitivity 226-2. The red sensitivity spectrum 224-1 and the green sensitivity spectrum 224-2 at the wavelength of the blue peak sensitivity 226-3 may each be greater than 40% of the blue peak sensitivity 226-3.

In yet other embodiments, the green sensitivity spectrum 224-2 and the blue sensitivity spectrum 224-3 at the wavelength of the red peak sensitivity 126-1 may each be greater than 50% of the red peak sensitivity 126-1. The red sensitivity spectrum 224-1 and the blue sensitivity spectrum 224-3 at the wavelength of the green peak sensitivity 226-2 may each be greater than 50% of the green peak sensitivity 226-2. The red sensitivity spectrum 224-1 and the green sensitivity spectrum 224-2 at the wavelength of the blue peak sensitivity 226-3 may each be greater than 50% of the blue peak sensitivity 226-3.

In some embodiments, the red sensitivity spectrum 224-1 may be greater than 30% through the visible spectrum (i.e., between 350 nm and 700 nm). In other embodiments, the green sensitivity spectrum 224-2 may be greater than 30% through the visible spectrum. In yet other embodiments, the blue sensitivity spectrum 224-3 may be greater than 30% through the visible spectrum. In at least one embodiment, each of the red sensitivity spectrum 224-1, green sensitivity spectrum 224-2, and blue sensitivity spectrum 224-3 may be greater than 30% through the visible spectrum.

In some embodiments, the red sensitivity spectrum 224-1 may be greater than 40% through the visible spectrum (i.e., between 350 nm and 700 nm). In other embodiments, the green sensitivity spectrum 224-2 may be greater than 40% through the visible spectrum. In yet other embodiments, the blue sensitivity spectrum 224-3 may be greater than 40% through the visible spectrum. In at least one embodiment, each of the red sensitivity spectrum 224-1, green sensitivity spectrum 224-2, and blue sensitivity spectrum 224-3 may be greater than 40% through the visible spectrum.

In some embodiments, the red sensitivity spectrum 224-1 may be greater than 50% through the visible spectrum (i.e., between 350 nm and 700 nm). In other embodiments, the green sensitivity spectrum 224-2 may be greater than 50% through the visible spectrum. In yet other embodiments, the blue sensitivity spectrum 224-3 may be greater than 50% through the visible spectrum. In at least one embodiment, each of the red sensitivity spectrum 224-1, green sensitivity spectrum 224-2, and blue sensitivity spectrum 224-3 may be greater than 50% through the visible spectrum.

The increased sensitivity of the red, green, and blue pixels of the imaging sensor may allow for greater light detection compared to a conventional CMOS sensor. A resulting image may appear to have reduced color fidelity and corresponding reduced color representation accuracy, however the total photon count observed by the detector will increase for a given photon flux. The resulting image with corresponding improved signal to noise ratio, but reduced color accuracy, may be beneficial in machine vision applications.

In other embodiments, the quantum efficiency (e.g., the proportion of incident photons that are detected and converted to signal) of an imaging sensor may be increased by broadening the peak width of each of the sensitivity spectrum. In some embodiments, a peak width may be the spectral width in nanometers of a sensitivity spectrum at 50% of the peak sensitivity of the sensitivity spectrum relative to the minimum transmission value of the optical filter in the visible spectrum. For example, in the embodiment depicted in FIG. 6, a red full width half maximum (FWHM) 228-1 of the red sensitivity spectrum 224-1 may be approximately 120 nm measured at approximately 70% of the red peak sensitivity 226-1 as the red sensitivity spectrum 224-1 has a minimum transmission value of approximately 40% in the visible spectrum. Accordingly, a green FWHM 228-2 of the green sensitivity spectrum 224-2 may be approximately 75 nm and a blue FWHM 228-2 of the blue sensitivity spectrum 224-3 may be approximately 90 nm.

In some embodiments, at least one of the red FWHM 228-1, the blue FWHM 228-2, and the green FWHM 228-3 may be at least 50 nm. In other embodiments, at least one of the red FWHM 228-1, the blue FWHM 228-2, and the green FWHM 228-3 may be at least 75 nm. In yet other, at least one of the red FWHM 228-1, the blue FWHM 228-2, and the green FWHM 228-3 may be at least 100 nm.

Figure 7:
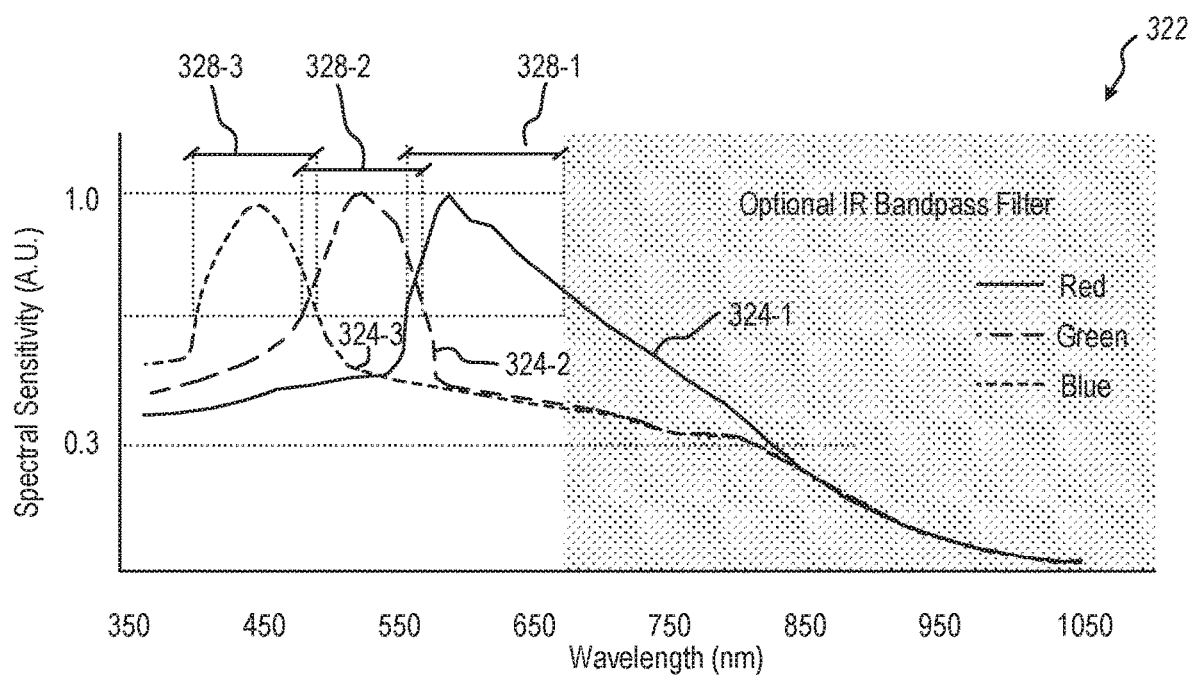
FIG. 7 is a graph of a spectral sensitivity of another embodiment of an increased sensitivity imaging sensor, according to at least one embodiment of the present disclosure.

In another embodiment, such as an embodiment depicted by the spectral sensitivity chart 322 in FIG. 7, an imaging sensor may have at least one broadened FWHM. For example, a broadened FWHM may be a FWHM that is greater than 100 nm. In other examples, a broadened FWHM may be a FWHM that is greater than 125 nm. In yet other examples, a broadened FWHM may be a FWHM that is greater than 150 nm.

FIG. 7 illustrates a red sensitivity spectrum 324-1, green sensitivity spectrum 324-2, and blue sensitivity spectrum 324-3. In some embodiments, the red sensitivity spectrum 324-1 may have a red FWHM 328-1 that is at least 100 nm. In other embodiments, the red sensitivity spectrum 324-1 may have a red FWHM 328-1 that is at least 125 nm. In yet other embodiments, the red sensitivity spectrum 324-1 may have a red FWHM 328-1 that is at least 150 nm.

In some embodiments, the green sensitivity spectrum 324-2 may have a green FWHM 328-2 that is at least 100 nm. In other embodiments, the green sensitivity spectrum 324-2 may have a green FWHM 328-2 that is at least 125 nm. In yet other embodiments, the green sensitivity spectrum 324-2 may have a green FWHM 328-2 that is at least 150 nm.

In some embodiments, the blue sensitivity spectrum 324-3 may have a blue FWHM 328-3 that is at least 100 nm. In other embodiments, the blue sensitivity spectrum 324-3 may have a blue FWHM 328-3 that is at least 125 nm. In yet other embodiments, the blue sensitivity spectrum 324-3 may have a blue FWHM 328-3 that is at least 150 nm.

In some embodiments, each of the red FWHM 328-1, green FWHM 328-2, and blue FWHM 328-3 may be greater than 100 nm. In other embodiments, each of the red FWHM 328-1, green FWHM 328-2, and blue FWHM 328-3 may be greater than 125 nm. In yet other embodiments, each of the red FWHM 328-1, green FWHM 328-2, and blue FWHM 328-3 may be greater than 150 nm.

Figure 8:
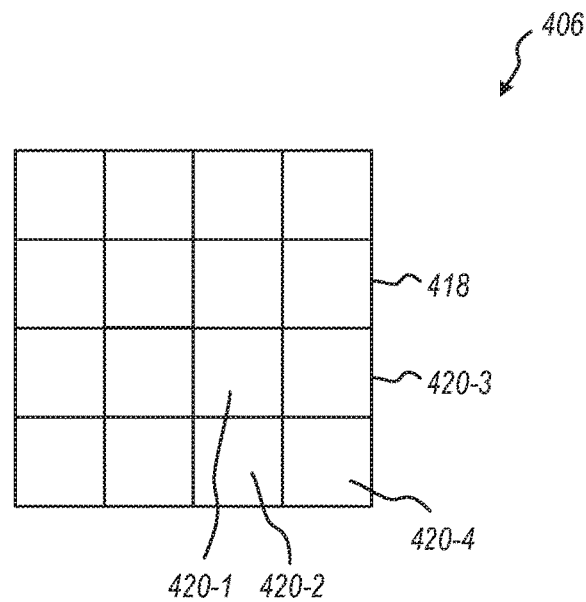
FIG. 8 is a top view of an embodiment of an increased sensitivity hybrid imaging sensor, according to at least one embodiment of the present disclosure.

While embodiments of imaging sensors have been described herein with a conventional RGB Bayer pattern, other embodiments may have more or less color channels incorporated into the Bayer pattern or other pixel distribution. FIG. 8 is a top view of an embodiment of a hybrid imaging sensor 406 with pixel array 418. In some embodiments, the pixel array 418 may have a plurality of domains including an infrared pixel 420-4. At least one of the other pixels may be sensitive to the visible spectrum.

For example, an imaging sensor 406 may include a red pixel 420-1, a green pixel 420-2, and a blue pixel 420-3, to provide a RGB color channel, while the infrared pixel 420-4 may having a sensitivity to the infrared portion of the available light spectrum to allow the hybrid imaging sensor 406 to collect both color images as well as infrared images. In some embodiments, at least one of the red pixel 420-1, green pixel 420-2, and blue pixel 420-3 may have a partial filter as described herein to increase the total light detection of the hybrid imaging sensor. In at least one embodiment, the infrared pixel 420-4 may include a partial filter to allow the infrared pixel 420-4 to detect at least some of the incident light upon the hybrid imaging sensor 406.

Figure 9:
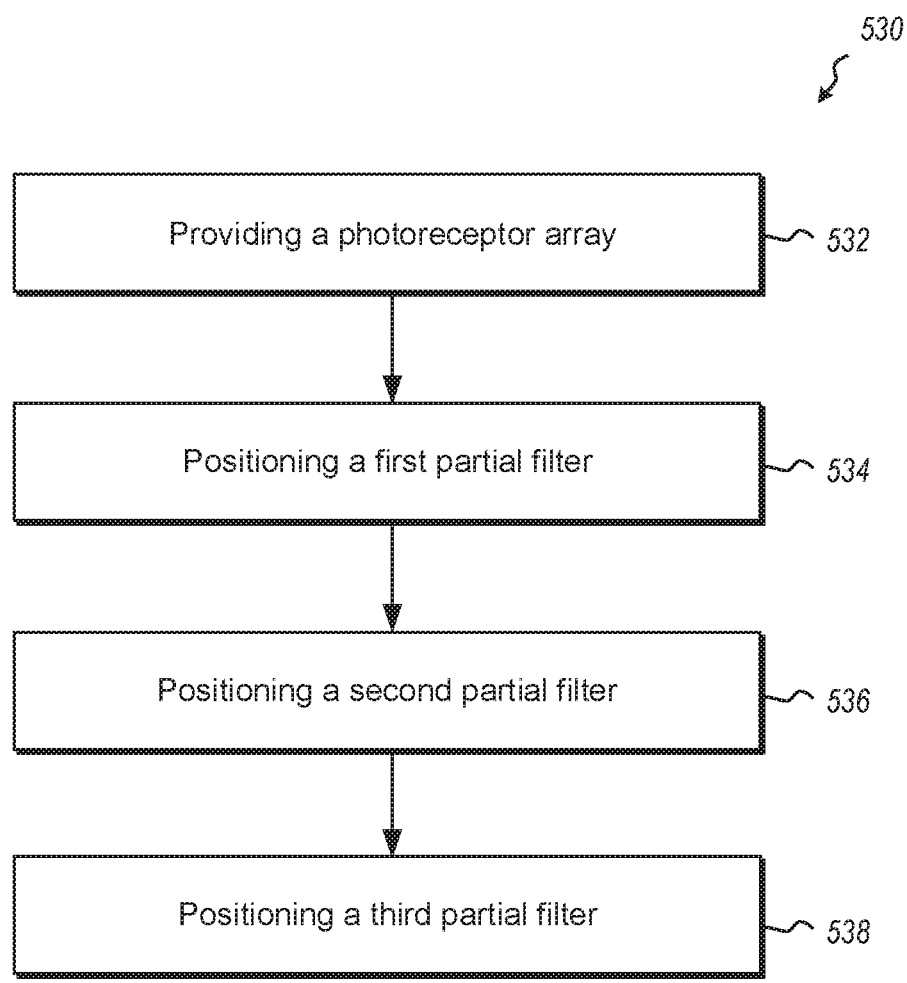
FIG. 9 is a flowchart illustrating an embodiment of a method of manufacturing an embodiment of an imaging sensor, according to at least one embodiment of the present disclosure.

FIG. 9 is a flowchart illustrating an embodiment of a method 530 of manufacture of an increased sensitivity imaging sensor according to the present disclosure. The method 530 may include providing a photoreceptor array at 532. In some embodiments, the photoreceptor array may be a CMOS array. In other embodiments, the photoreceptor array may be a CCD array. The method 530 may further include applying a plurality of partial filters to the photoreceptor array to partially filter visible light from the pixels of the photoreceptor array.

For example, a dyed or otherwise tinted film or coating may be positioned proximate a surface of the photoreceptor array to intercept light incident on the surface of the photoreceptor array. Conventional color filters in color imaging sensors utilize a color filter positioned proximate a surface of the imaging sensor. An increased sensitivity imaging sensor according to the present disclosure may utilize a filter with a reduced thickness/density relative to a conventional filter. In some embodiments, the pigment and/or dye may be the same, with a reduced thickness/density. By reducing the thickness/density of a conventional pigment and/or dye, the overall attenuation may be reduced, increasing the optical transmission of the filter and increasing the number of photons received and detected by the imaging sensor. In other embodiments, a different pigment and/or dye may be used with a higher optical transmission.

In some embodiments, a first partial filter may be positioned proximate a first pixel of a domain of the photoreceptor array at 534. For example, the first partial filter may be a red partial filter. In other examples, the first partial filter may be a yellow partial filter. A second partial filter may be positioned proximate a second pixel of the domain of the photoreceptor array at 536. In some examples, the second partial filter may be a green partial filter. In other examples, the second partial filter may be a cyan partial filter. A third partial filter may be positioned proximate a third pixel of the domain of the photoreceptor array at 538. In some examples, the third partial filter may be a blue partial filter. In other examples, the third partial filter may be a magenta partial filter.

In yet other embodiments, the method 530 may further include positioning a fourth partial filter proximate a fourth pixel of the domain. In some examples, the fourth partial filter may be partial infrared filter that partially filters the visible light and transmits infrared light to the fourth pixel of the photoreceptor to image infrared light.

In at least one embodiment, an imaging sensor according to the present disclosure may provide imaging with a plurality of color channels while detecting a greater proportion of the incident light than a conventional color imaging sensor. The overall efficiency of the imaging sensor may be increased, allowing for improved grayscale images, without sacrificing color detection.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A device for detecting light, the device comprising:
   a photoreceptor array sensitive to a visible light spectrum, the photoreceptor array having a domain including:
      a first wavelength sensor having a first peak sensitivity at a first wavelength in the visible light spectrum;
      a second wavelength sensor having a second peak sensitivity at a second wavelength in the visible light spectrum; and
      a third wavelength sensor having a third peak sensitivity at a third wavelength in the visible light spectrum,
      wherein the first wavelength sensor has a first base sensitivity at least 30% of the first peak sensitivity at the second wavelength and third wavelength, the second wavelength sensor has a second base sensitivity of at least 30% of the second peak sensitivity at the first wavelength and third wavelength, and the third wavelength sensor has a third base sensitivity with at least 30% of the third peak sensitivity at the first wavelength and second wavelength.

2. The device of claim 1, the first wavelength being between 400 nanometers (nm) and 500 nm.

3. The device of claim 1, the second wavelength being between 500 nm and 600 nm.

4. The device of claim 1, the third wavelength being between 600 nm and 700 nm.

5. The device of claim 1, the first wavelength sensor having a first full-width half maximum relative to a minimum transmission of a first sensitivity spectrum in a visible spectrum about the first wavelength of at least 100 nm.

6. The device of claim 1, the second wavelength sensor having a second full-width half maximum relative to a minimum transmission of a second sensitivity spectrum in a visible spectrum about the second wavelength of at least 50 nm.

7. The device of claim 1, the third wavelength sensor having a third full-width half maximum relative to a minimum transmission of a third sensitivity spectrum in a visible spectrum about the third wavelength of at least 50 nm.

8. The device of claim 1, each of the first wavelength sensor, the second wavelength sensor, and the third wavelength sensor having a sensitivity spectrum with a full-width half maximum of at least 50 nm.

9. A device for detecting light, the device comprising:
   a photoreceptor array sensitive to the visible light spectrum, the photoreceptor array having a Bayer pattern including:
      a first wavelength sensor having a first peak sensitivity at a first wavelength in the visible light spectrum;

a second wavelength sensor having a second peak sensitivity at a second wavelength in the visible light spectrum;

a third wavelength sensor having a third peak sensitivity at a third wavelength in the visible light spectrum; and a fourth wavelength sensor having a fourth peak sensitivity at a fourth wavelength in an infrared spectrum, wherein the first wavelength sensor has a first base sensitivity at least 30% of the first peak sensitivity at the second wavelength and third wavelength, the second wavelength sensor has a second base sensitivity of at least 30% of the second peak sensitivity at the first wavelength and third wavelength, and the third wavelength sensor has a third base sensitivity with at least 30% of the third peak sensitivity at the first wavelength and second wavelength.

10. The device of claim 9, the first wavelength sensor having a first wavelength filter, the first wavelength filter filtering less than 50% of visible light incident to the first wavelength sensor.

11. The device of claim 9, the second wavelength sensor having a second wavelength filter, the second wavelength filter filtering less than 50% of visible light incident to the second wavelength sensor.

12. The device of claim 9, the third wavelength sensor having a third wavelength filter, the third wavelength filter filtering less than 50% of visible light incident to the third wavelength sensor.

13. The device of claim 9, a quantum efficiency of the photoreceptor array in the visible light spectrum and the infrared spectrum being greater than 50%.

14. The device of claim 9, the first wavelength sensor having a first full-width half-maximum of at least 50 nm relative to a minimum transmission of a first sensitivity spectrum in a visible spectrum.

15. The device of claim 9, the second wavelength sensor having a second full-width half-maximum of at least 50 nm relative to a minimum transmission of a second sensitivity spectrum in a visible spectrum.

16. The device of claim 9, the third wavelength sensor having a third full-width half-maximum of at least 50 nm relative to a minimum transmission of a third sensitivity spectrum in a visible spectrum.

17. A method of manufacturing an imaging sensor,
providing a photoreceptor array having at least one domain;
positioning a first partial notch filter over a first pixel of a domain of the photoreceptor array;
positioning a second partial notch filter over a second pixel of the domain of the photoreceptor array; and
positioning a third partial notch filter over a third pixel of the domain of the photoreceptor array.

18. The method of claim 17, further comprising positioning an infrared partial notch filter over a fourth pixel of the domain of the photoreceptor array.

19. The method of claim 17, wherein each of the first partial notch filter, the second partial notch filter, and the third partial notch filter attenuates less than 50% of an incident light incident upon each of the first partial notch filter, the second partial notch filter, and the third partial notch filter.

20. The method of claim 17, wherein the first partial notch filter is a red partial notch filter, the second partial notch filter is a green partial notch filter, and the third partial notch filter is a blue partial notch filter.

* * * * *